United States Patent [19]

Takahashi

[11] Patent Number: 4,927,111
[45] Date of Patent: May 22, 1990

[54] BOARD MOUNT

[75] Inventor: Katsumasa Takahashi, Nagoya, Japan

[73] Assignee: Kitagawa Industries Co., Ltd., Japan

[21] Appl. No.: 260,568

[22] Filed: Oct. 21, 1988

[30] Foreign Application Priority Data

Nov. 2, 1987 [JP] Japan .................. 62-168347

[51] Int. Cl.⁵ .............................................. H02B 1/02
[52] U.S. Cl. ................................ 248/500; 361/415; 211/41
[58] Field of Search .................... 248/27.3, 73, 220.2, 248/220.3, 221.4, 224.4, 229, 309.1, 310, 316.1, 314, 500; 211/41; 24/297; 403/326, 330; 361/413, 415

[56] References Cited

U.S. PATENT DOCUMENTS

| | | |
|---|---|---|
| 3,231,785 | 1/1966 | Calabro .............................. 361/415 |
| 3,444,596 | 5/1969 | Soltysik ............................... 248/73 |
| 3,567,998 | 3/1971 | Ammerman ....................... 361/415 |
| 3,829,741 | 8/1974 | Athey ................................. 361/415 |
| 3,932,016 | 1/1976 | Ammenheuser ................... 361/415 |
| 3,944,177 | 3/1976 | Yoda .................................... 248/73 |
| 4,192,478 | 3/1980 | Coules . |
| 4,477,135 | 10/1984 | Pronto ................................ 211/41 |
| 4,533,977 | 8/1985 | Koppensteiner .................... 211/41 |
| 4,550,362 | 10/1985 | Reimer . |

FOREIGN PATENT DOCUMENTS

| | | |
|---|---|---|
| 969158 | 6/1975 | Canada ................................ 248/73 |
| 1006613 | 3/1977 | Canada . |
| 2455866 | 6/1975 | Fed. Rep. of Germany ........ 248/73 |
| 48-289 | 6/1973 | Japan . |
| 797093 | 1/1981 | U.S.S.R. ............................. 361/415 |
| 2142687 | 1/1985 | United Kingdom . |

*Primary Examiner*—Ramon O. Ramirez
*Assistant Examiner*—Robert A. Olson
*Attorney, Agent, or Firm*—Oliff & Berridge

[57] ABSTRACT

A device for mounting a board, like a printed circuit board, upright on a mounting surface, like the chassis of an electronic device. A solid base plate prevents stretching, slippage and short-circuits. A hook on the back of the device permits easy removal of the board.

9 Claims, 3 Drawing Sheets

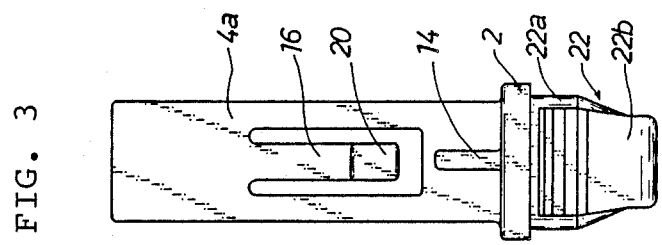
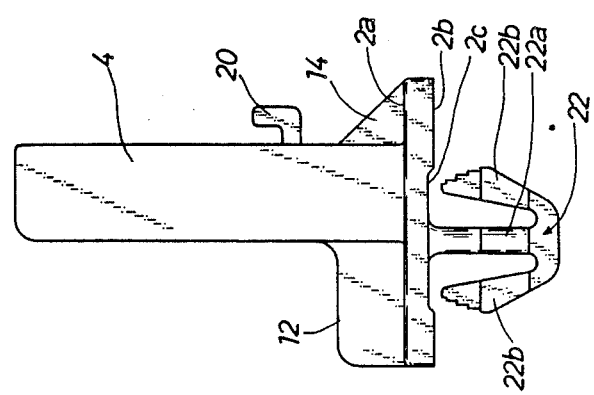
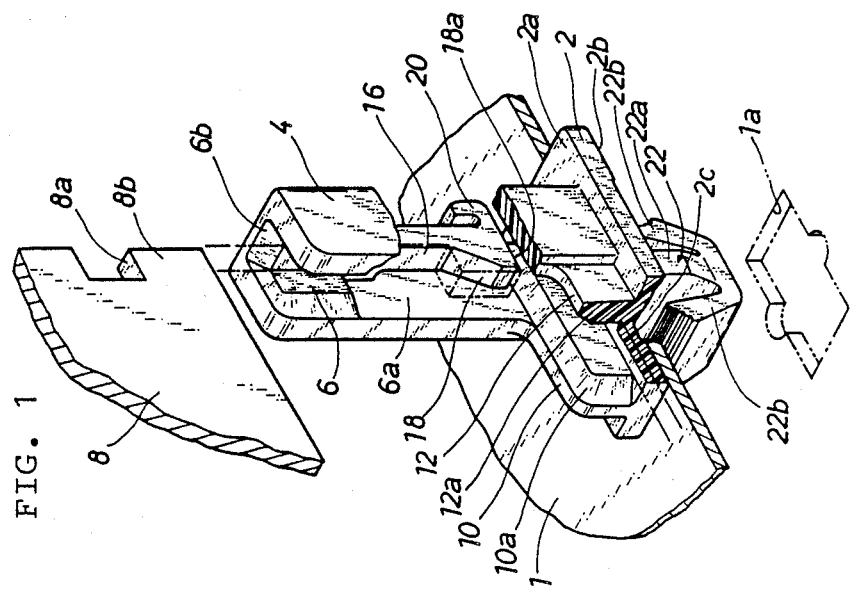

BOARD MOUNT

BACKGROUND OF THE INVENTION

1. Field of the Invention

This board mount secures a board, like a printed circuit board, upright on a mounting surface, like the chassis of an electric device.

2. Description of the Prior Art

There are currently many kinds of board mounts for securing a board upright on a mounting surface without using screws. One example is the board mount in Japanese Published Examined Utility Model Application 48-289, which has a retaining slot, running from top to bottom, that opens toward the board. The retaining slot includes a strip in one side wall that descends parallel to the standing board. The strip has a pin that projects into the slot. When the board is inserted into the slot, the pin snaps into a notch in the board, thus securing the board.

The lower surface of the board mount has a pair of hooks that project downward from both sides of the base of the slot. These hooks are for holding the board mount in place when it is plugged into a hole in the mounting surface. When the board is inserted, the retaining slot stretches both right and left, pushing the hooks away from each other, thus attaching the board to the mounting surface at a fixed angle.

The prior-art board mount is not easy to handle. To dismount a board, one must bend the strip on the side of the mount to disengage the pin from the board notch. When several boards are mounted in parallel on a mounting surface using the prior-art board mounts, the intervals between the boards may be so narrow that the strip becomes inaccessible.

Another problem arises because the board mount is secured to the mounting surface by pressure on the hooks, which stretch out while the board is in the retaining slot. Once the board is removed from the board mount, that pressure disappears and the board mount is likely to come loose from the mounting surface.

Moreover, the retaining slot stretches with use, thus loosening the connection between the pin on the strip and the notch in the board. If that happens, the board is likely to slip from the board mount rather than remain securely fastened to the mounting surface.

The present invention solves these problems by providing an easily used board mount that securely fastens a board to a mounting surface

SUMMARY OF THE INVENTION

The present invention supports a board above a mounting surface using a slot in a brace on a base plate to hold a corner of the board. When the board is inserted into the slot, a corner of the board pushes back a strip with a pin on the back of the brace. When a notch in the board reaches the pin, the pin snaps into the notch, thus securing the board in the slot. An anchor descending from the underside of the base plate plugs into a mounting hole on the mounting surface, thus securing the board on the mounting surface. The board can be easily removed by pulling on a hook with a finger tip or any tool tip, which bends back the strip and disengages the pin from the notch. Hence the board mount is easy to use and is able to fasten a board securely to a mounting surface.

Board mounts of the present invention facilitate the mounting of several boards in parallel on one mounting surface, as shown in FIG. 8. Since the hook on the strip is on the back of the brace, it is exposed to the user, thus permitting easy removal of the secured board. The exposed hook is readily reached and manipulated by a finger tip or the tip of any tool, even when the boards are close together. Even after the board is removed, the anchor holds the board mount securely in the mounting hole. Furthermore, because the strip is formed on the back of the brace and because the base plate spans the slot, the coupling of the locking pin and the notch is not subject to stretching of the slot which plagues the prior-art board mounts, so the board remains securely fixed to the mounting surface.

DESCRIPTION OF THE DRAWINGS

FIG. 1 is a partially sectional, perspective view of a board mount according to one embodiment of the present invention.

FIG. 2 is a side view.

FIG. 3 is a rear view.

DESCRIPTION OF THE PREFERRED EMBODIMENT

Figure 7:
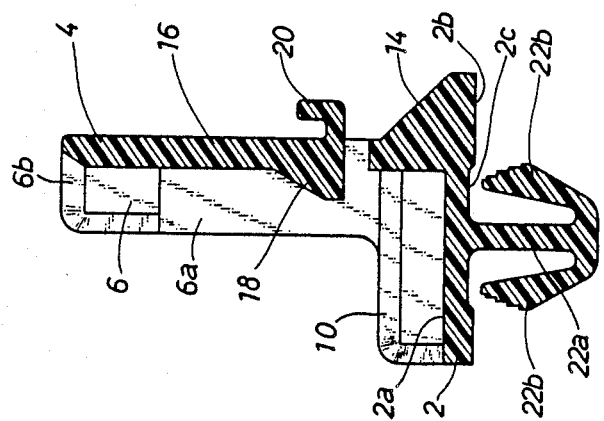
FIG. 7 is a sectional view seen from the right. The section is taken along line VII—VII in FIG. 4.
Figure 5:
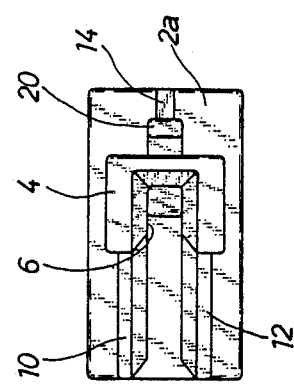
FIG. 5 is a top plan view.
Figure 6:
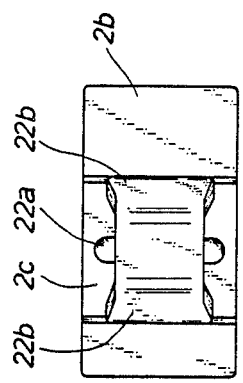
FIG. 6 is a bottom plan view.
Figure 4:
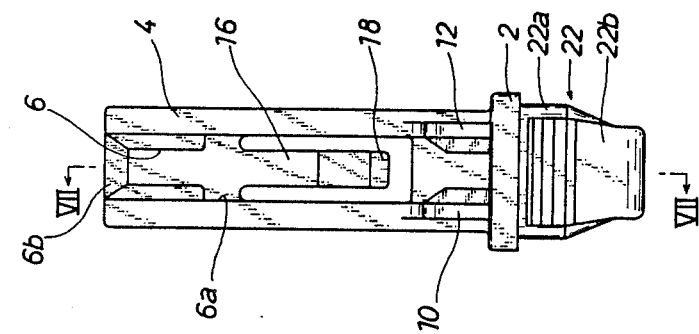
FIG. 4 is a front view.

This is a description of the embodiment of the present invention shown in the drawings.

The board mount is molded as a single piece from a synthetic resin, such as nylon resin. It has a base plate 2 that rests on a mounting surface 1, such as the chassis of an electric device. A brace 4 rises perpendicularly from the upper surface 2a of the base plate 2. The underside 2b of the base plate 2 faces the mounting surface 1.

The brace 4 has a rectangular slot 6 that runs vertically along the length of the brace 4. The width of a this slot 6 equals or slightly exceeds the thickness of a board 8, such as a printed circuit board. The upper end 6a of the slot 6 is flared for easy insertion of a board 8 into the slot 6.

A pair of side braces 10 and 12 extends from the brace 4 on the same side as the slot 6, and maintains the same width as the slot 6. The side braces 10 and 12 buttress the brace 4 against the base plate 2, and supply additional lateral support for the board 8. They 10 and 12, too, are flared at their upper edges 10*l* and 12*a* to facilitate insertion of the board 8. The brace 4 also has a buttress 14 on the side opposite the slot 6 to prop the brace 4 against the base plate 2.

The back 4a of the brace 4 has a U-shaped aperture delimiting a resilient strip 16. The free end of this strip 16 has a contact surface 18a on its bottom and a wedge-shaped locking pin 18 that projects into the slot 6. The strip 16 also has a hook 20 that projects backward from the bottom of the strip 16. The slot 6 is wider in its middle section 6a, by an amount corresponding to the width of the arms of the U-shaped aperture, so the strip 16 can be as wide as the board 8, permitting a larger contact surface 18a for greater retaining ability.

The underside 2b of the base plate 2 has a recessed midsection 2c. A resilient anchor 22 descends from the midsection 2c. This anchor 22 consists of a shank 22a that extends from the midsection 2c, and a pair of resilient anchor arms 22b that slant up and away from the free end of the shank 22a toward the midsection 2c. The recessed midsection 2c allows rounded corners between the shank 22a and the underside 2b of the base plate 2, thus reducing fatigue. The ends of the anchor arms 22b are barbed to prevent slippage.

The mounting surface 1 has a nearly rectangular mounting hole 1a shaped as shown in FIG. 1 by the indicated dotted line. The length of this hole 1a is shorter than the unencumbered span of the anchor arms 22b. The board 8 has a rectangular notch 8a on the side edge of a retained corner 8b of the board 8.

Figure 8:
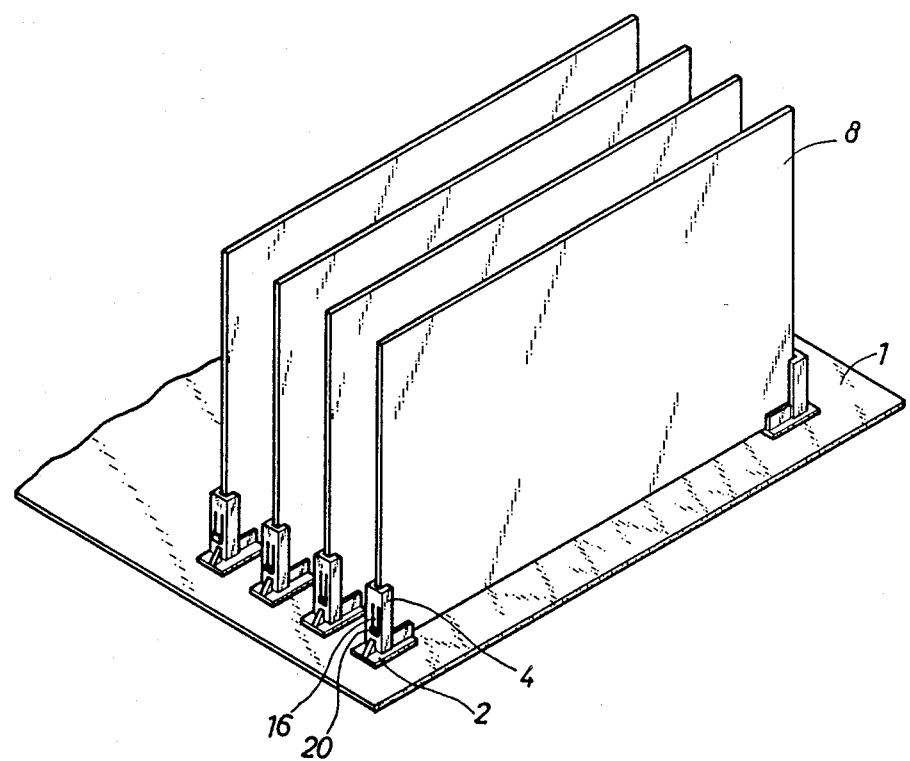
FIG. 8 illustrates one application of the board mount.

The anchor 22 is plugged into the mounting hole 1a by squeezing the anchor arms 22b through the hole 1a until the underside 2b touches the mounting surface 1. Then, the anchor arms 22b spread out, engaging the mounting hole 1a with their barbed ends. As illustrated in FIG. 8, board mounts of this embodiment are typically used in pairs with their slots facing each other and with their anchors 22 inserted into matching mounting holes 1a (not indicated in FIG. 8) on the mounting surface 1.

When the board 8 is inserted into the slot 6, its corner 8b encounters the wedge-shaped locking pin 18. The corner 8b pushes the pin 18 out of the slot 6 by bending the resilient strip 16. The board 8 is inserted until its corner 8b reaches the upper surface 2a of the base plate 2. By thus separating the board 8 and the mounting surface 1, the board mount of this invention prevents a short-circuit between the mounting surface 1 and a connecting terminal (not shown), or the like, on the board 8.

When the corner 8b reaches the base plate 2, the locking pin 18 snaps into the notch 8a due to the resilience of the strip 16. The contact surface 18a of the pin 18 abuts the lower surface of the notch 8a. This coupling of the notch 8a and the pin 18 secures the board 8 on the mounting surface 1. If an external force pulls on the board 8, the strip 16 bends toward the notch 8a, thus actually strengthening the hold the board mount has on the board 8.

To remove the board 8, simply pull on the hook 20 with a finger tip or the tip of a tool like a screwdriver. This action bends the strip 16, releasing the locking pin 18 from the notch 8a in the board 8. After that, the board is easily withdrawn from the slot 6.

This is just one embodiment of the present invention. The claim is not limited to any of the details of this description, and should be construed broadly within its general principles.

I claim:

1. A board mount for mounting a board on a mounting surface comprising:
   a. a base plate for resting on the mounting surface;
   b. a brace rising from an upper surface of the base plate, the brace having:
      i. a slot for holding a corner of the board in the brace, and
      ii. a resilient strip formed on the back of the brace with:
         A. a locking pin on the lower end of the strip projecting forward into the slot, and
         B. a hook means on the lower end of the strip for allowing insertion of a tool therein to move the resilient strip and retract the locking pin from said slot; and
   c. an anchor descending from the underside of the base plate for inserting into a mounting hole provided on the mounting surface.

2. A board mount, as in claim 1, where the base plate spans the lower end of the slot in the brace.

3. A board mount, as in claim 1, where the locking pin is sloped on the surface where an inserted board initially touches the pin so the board pushes the pin out of the slot.

4. A board mount, as in claim 1, where the locking pin has a flat contact surface on the bottom of the pin.

5. A board mount, as in claim 1, where the base plate has a recessed midsection on its underside and the anchor is attached to the base plate at the recesses midsection.

6. A board mount, as in claim 1, where the middle section of the slot is flared to permit a wider resilient strip.

7. A board mount, as in claim 1, wherein the base plate extends behind the brace.

8. A board mount, as in claim 7, wherein a gusset is installed between the brace and the portion of the base plate that extends behind the brace.

9. A board mount for mounting on a board mounting surface comprising:
   a. a base plate for resting on the mounting surface, the base plate having a recessed midsection on its underside;
   b. a brace mounted on an upper surface of the base plate such that the base plate extends behind the brace, the brace having:
      i. a slot for holding a corner of the board in the brace, and
      ii. a resilient strip formed on the back of the brace with
         A. a locking pin on the lower end of the strip projecting forward into the slot, and
         B. a hook means on the lower end of the strip for allowing insertion of a tool therein to move the resilient strip and retract the locking pin from said slot;
   c. an anchor attached to the base plate at the recessed midsection and descending from the baseplate for inserting into a mounting hole on the mounting surface; and
   d. a gusset installed between the brace and the portion of the base plate that extends behind the brace.

* * * * *